United States Patent
Xiao et al.

(10) Patent No.: US 6,322,640 B1
(45) Date of Patent: Nov. 27, 2001

(54) MULTIPLE THERMAL ANNEALING METHOD FOR FORMING ANTIFERROMAGNETIC EXCHANGE BIASED MAGNETORESISTIVE (MR) SENSOR ELEMENT

(75) Inventors: Rongfu Xiao, Fremont; Chyu-Jiuh Torng; Hui-Chuan Wang, both of Pleasanton; Jei-Wei Chang, Cupertino; Cherng-Chyi Han, San Jose; Kochan Ju, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/489,969

(22) Filed: Jan. 24, 2000

(51) Int. Cl.$^7$ ...................................................... H01F 41/00
(52) U.S. Cl. ......................................... 148/308; 29/603.08
(58) Field of Search ............................. 148/108; 360/113; 29/603.08

(56) References Cited

U.S. PATENT DOCUMENTS

| | | | |
|---|---|---|---|
| 5,764,056 | 6/1998 | Mao et al. | 324/252 |
| 5,772,794 | 6/1998 | Uno et al. | 148/108 |
| 5,843,589 | 12/1998 | Hoshiya et al. | 428/692 |
| 5,867,351 | 2/1999 | Gill | 360/113 |
| 6,105,237 | * 9/2000 | Gill | 29/603.08 |
| 6,123,780 | * 9/2000 | Kanai et al. | 148/108 |

* cited by examiner

*Primary Examiner*—John Sheehan
(74) *Attorney, Agent, or Firm*—George O. Saile; Stephen B. Ackerman; Alek Szecsy

(57) ABSTRACT

A method for forming a magnetically biased magnetoresistive (MR) layer. There is first provided a substrate. There is then formed over the substrate a ferromagnetic magnetoresistive (MR) material layer. There is then forming contacting the ferromagnetic magnetoresistive (MR) material layer a magnetic material layer formed of a first crystalline phase, where the magnetic material layer is formed of a crystalline multiphasic magnetic material having the first crystalline phase which does not appreciably antiferromagnetically exchange couple with the ferromagnetic magnetoresistive (MR) material layer and a second crystalline phase which does appreciably antiferromagnetically exchange couple with the ferromagnetic magnetoresistive (MR) material layer. There is then annealed thermally while employing a first thermal annealing method employing an extrinsic magnetic bias field the magnetic material layer formed of the first crystalline phase to form a magnetically aligned magnetic material layer formed of the first crystalline phase. Finally, there is then annealed thermally while employing a second thermal annealing method without employing an extrinsic magnetic bias field the magnetically aligned magnetic material layer formed of the first crystalline phase to form an antiferromagnetically coupled magnetically aligned magnetic material layer formed of the second crystalline phase. The method may be employed for forming non-parallel antiferromagnetically biased multiple magnetoresistive (MR) layer magnetoresistive (MR) sensor elements while employing a single antiferromagnetic material.

17 Claims, 6 Drawing Sheets

MULTIPLE THERMAL ANNEALING METHOD FOR FORMING ANTIFERROMAGNETIC EXCHANGE BIASED MAGNETORESISTIVE (MR) SENSOR ELEMENT

CROSS-REFERENCE TO RELATED APPLICATION

This application is related to co-assigned applications: (1) Ser. No. 09/182,761, filed Oct. 30, 1998, titled "Canted Longitudinal Patterned Exchange Biased Dual-Stripe Magnetoresistive (DSMR) Sensor Element and Method for Fabrication Thereof"; (2) Ser. No. 09/182,775, also filed Oct. 30, 1998, titled "Anti-Parallel Longitudinal Patterned Exchange Biased Dual Stripe Magnetoresistive (DSMR) Sensor Element and Method for Fabrication Thereof"; and Ser. No. 09/415,247, filed Oct. 12, 1999, titled "Method for Forming a Second Antiferromagnetic Exchange-Coupling Layer for Magnetoresistive (MR) and Giant MR (GMR) Applications," the teachings and citations from each of which related co-assigned applications are incorporated herein fully by reference.

BACKGROUND OF THE INVENTION

1. Field of the Invention

The present invention relates generally to methods for fabricating magnetic sensor elements. More particularly, the present invention relates to methods for fabricating non-parallel magnetically biased multiple magnetoresistive (MR) layer magnetoresistive (MR) sensor elements.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein.

Within the general category of magnetoresistive (MR) sensor elements, magnetoresistive (MR) sensor elements which employ multiple magnetoresistive (MR) layers (typically including a pair of magnetoresistive (MR) layers), such as but not limited to dual stripe magnetoresistive (DSMR) sensor elements and spin valve magnetoresistive (SVMR) sensor elements, and in particular magnetoresistive (MR) sensor elements which employ multiple magnetoresistive (MR) layers at least one of which is magnetically biased to provide non-parallel magnetic bias directions of the multiple magnetoresistive (MR) layer magnetoresistive (MR) sensor elements, such as nominally anti-parallel longitudinally magnetically biased dual stripe magnetoresistive (DSMR) sensor elements and nominally perpendicularly magnetically biased spin valve magnetoresistive (SVMR) sensor elements, are presently of considerable interest insofar as the magnetically biased magnetoresistive (MR) layers employed within such magnetically biased multiple magnetoresistive (MR) layer magnetoresistive (MR) sensor elements typically provide enhanced magnetic read signal amplitude and fidelity in comparison with single stripe magnetoresistive (MR) sensor elements, non-magnetically biased multiple magnetoresistive (MR) layer magnetoresistive (MR) sensor elements and parallel magnetically biased multiple magnetoresistive (MR) layer magnetoresistive (MR) sensor elements.

While non-parallel magnetically biased multiple magnetoresistive (MR) layer magnetoresistive (MR) sensor elements such as but not limited to nominally anti-parallel longitudinally magnetically biased dual stripe magnetoresistive (DSMR) sensor elements and nominally perpendicularly magnetically biased spin valve magnetoresistive (SVMR) sensor elements are thus desirable within the art of digitally encoded magnetic data storage and retrieval, non-parallel multiple magnetoresistive (MR) layer magnetoresistive (MR) sensor elements are nonetheless not fabricated entirely without problems in the art of magnetoresistive (MR) sensor element fabrication. In particular, it is often difficult to form non-parallel magnetically biased multiple magnetoresistive (MR) layer magnetoresistive (MR) sensor elements with optimal and enhanced magnetic properties since a magnetic biasing of a later formed magnetoresistive (MR) layer within a non-parallel magnetically biased multiple magnetoresistive (MR) layer magnetoresistive (MR) sensor element will often compromise a magnetic biasing of an earlier formed magnetoresistive (MR) layer within the non-parallel magnetically biased multiple magnetoresistive (MR) layer magnetoresistive (MR) sensor element.

It is thus towards the goal of providing, for use within magnetic data storage and retrieval, a method for forming a non-parallel magnetically biased multiple magnetoresistive (MR) layer magnetoresistive (MR) sensor element with optimal and enhanced magnetic properties, that the present invention is most generally directed.

Various methods and resultant magnetoresistive (MR) sensor element structures have been disclosed in the art of magnetoresistive (MR) sensor element fabrication for forming magnetically biased magnetoresistive (MR) sensor elements with enhanced functionality, enhanced reliability or other desirable properties.

For example, Mao et al., in U.S. Pat. No. 5,764,056, discloses a spin valve magnetoresistive (SVMR) sensor element which simultaneously possesses an enhanced thermal stability and an enhanced pinning field. To realize the foregoing objects, the spin valve magnetoresistive (SVMR) sensor element employs a pinned ferromagnetic material layer of thickness less than about 100 angstroms, wherein the pinned ferromagnetic material layer has formed laminated thereupon a nickel-manganese alloy antiferromagnetic pinning material layer of thickness less than about 200 angstroms.

In addition, Uno et al., in U.S. Pat. No. 5,772,794, discloses a method for forming a spin valve magnetoresistive (SVMR) sensor element, wherein there is provided an enhanced magnetic anisotropy within a pinned magnetoresistive (MR) layer within the spin valve magnetoresistive (SVMR) sensor element. The method realizes the foregoing object by employing when fabricating the spin valve magnetoresistive (SVMR) sensor element a final heat treatment step, where the final heat treatment step employs application of a magnetic field in a direction perpendicular to a track width direction of the spin valve magnetoresistive (SVMR) sensor element so that the pinned magnetoresistive (MR) layer within the spin valve magnetoresistive (SVMR) sensor element is pinned by a pinning material layer within the spin valve magnetoresistive (SVMR) sensor element with the enhanced uniaxial anisotropy.

Further Hoshiya et al., in U.S. Pat. No. 5,843,589, disclose a magnetoresistive (MR) sensor element, and a magnetic data storage system which employs the magnetoresistive (MR) sensor element, where the magnetoresistive (MR) sensor element has an enhanced exchange coupling and an enhanced thermal stability. To realize the foregoing objects, the magnetoresistive (MR) sensor element employs a cobalt or cobalt alloy ferromagnetic material layer having laminated thereupon an antiferromagnetic material layer formed of a chromium-manganese based alloy.

Finally, Gill, in U.S. Pat. No. 5,867,351, discloses a spin valve magnetoresistive (SVMR) sensor element where an antiferromagnetic pinning material layer within the spin valve magnetoresistive (SVMR) sensor element pins a ferromagnetic pinned layer with the spin valve magnetoresistive (SVMR) sensor element with a high coercivity while simultaneously not significantly impacting the coercivity of a ferromagnetic free layer within the spin valve magnetoresistive (SVMR) sensor element. The spin valve magnetoresistive (SVMR) sensor element realizes the foregoing object by employing when forming the spin valve magnetoresistive (SVMR) sensor element the antiferromagnetic pinning material layer formed of an amorphous magnetic material, such as a terbium-iron-cobalt amorphous magnetic material or a samarium-cobalt amorphous magnetic material, which possesses a high magnetic coercivity and a low magnetic moment.

Desirable within the art of non-parallel magnetically biased multiple magnetoresistive (MR) layer magnetoresistive (MR) sensor element fabrication are additional methods and materials which may be employed for forming non-parallel magnetically biased multiple magnetoresistive (MR) layer magnetoresistive (MR) sensor elements with optimal and enhanced magnetic properties.

It is towards the foregoing object that the present invention is directed.

SUMMARY OF THE INVENTION

A first object of the present invention is to provide a method for fabricating a non-parallel magnetically biased multiple magnetoresistive (MR) layer magnetoresistive (MR) sensor element, where the non-parallel magnetically biased multiple magnetoresistive (MR) layer magnetoresistive (MR) sensor element is formed with optimal and enhanced magnetic properties.

A second object of the present invention is to provide a method for forming a non-parallel magnetically biased multiple magnetoresistive (MR) layer magnetoresistive (MR) sensor element in accord with the first object of the present invention, which method is readily commercially implemented.

In accord with the objects of the present invention, there is provided by the present invention a method for magnetically biasing a magnetoresistive (MR) layer. To practice the method of the present invention, there is first provided a substrate. There is then formed over the substrate a ferromagnetic magnetoresistive (MR) material layer. There is then formed contacting the ferromagnetic magnetoresistive (MR) material layer a magnetic material layer formed of a first crystalline phase, where the magnetic material layer is formed of a crystalline multiphasic magnetic material having the first crystalline phase which does not appreciably antiferromagnetically exchange couple with the ferromagnetic magnetoresistive (MR) material layer and a second crystalline phase which does appreciably antiferromagnetically exchange couple with the ferromagnetic magnetoresistive (MR) material layer. There is then annealed thermally while employing a first thermal annealing method employing an extrinsic magnetic bias field the magnetic material layer formed of the first crystalline phase to form a magnetically biased magnetic material layer formed of the first crystalline phase. There is then annealed thermally while employing a second thermal annealing method without an extrinsic magnetic bias field the magnetically biased magnetic material layer formed of the first crystalline phase to form an antiferromagnetically coupled magnetically biased magnetic material layer formed of the second crystalline phase.

The present invention provides a method for fabricating a non-parallel magnetically biased multiple magnetoresistive (MR) layer magnetoresistive (MR) sensor element, where the non-parallel magnetically biased multiple magnetoresistive (MR) layer magnetoresistive (MR) sensor element is fabricated with optimal and enhanced magnetic properties. The method of the present invention realizes the foregoing objects by employing when forming the non-parallel magnetically biased multiple magnetoresistive (MR) layer magnetoresistive (MR) sensor element a magnetic material layer formed contacting a ferromagnetic magnetoresistive (MR) material layer, where the magnetic material layer is formed of a crystalline multiphasic magnetic material having a first crystalline phase which does not appreciably antiferromagnetically exchange couple with the ferromagnetic magnetoresistive (MR) material layer and a second crystalline phase which does appreciably antiferromagnetically exchange couple with the ferromagnetic magnetoresistive (MR) material layer. There is then annealed thermally while employing a first thermal annealing method employing an extrinsic magnetic bias field the magnetic material layer formed of the first crystalline phase to form a magnetically biased magnetic material layer formed of the first crystalline phase. There is then annealed thermally while employing a second thermal annealing method without an extrinsic magnetic bias field the magnetically biased magnetic material layer formed of the first crystalline phase to form an antiferromagnetically exchange coupled magnetically biased magnetic material layer formed of the second crystalline phase. By employing within the method of the present invention the two step thermal annealing method, there may be employed a pair of temperatures within the two step thermal annealing method such that there is avoided when fabricating a magnetoresistive (MR) sensor element within which is formed the magnetoresistive (MR) layer degradation of other layers within the magnetoresistive (MR) sensor element.

The method of the present invention is readily commercially implemented. The method of the present invention employs thermal annealing methods which are generally known in the art of magnetoresistive (MR) sensor element fabrication. Since it is at least in part a process control, in conjunction with a materials selection, within the present invention which provides at least in part the method of the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
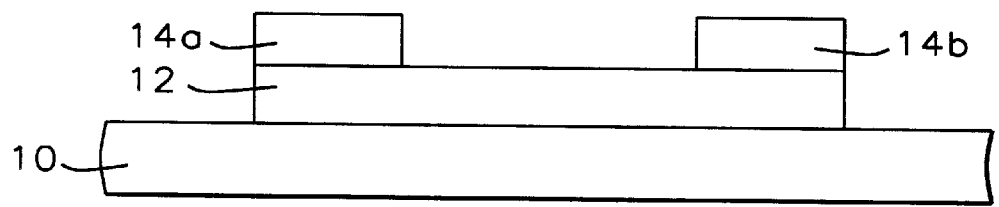
FIG. 1, FIG. 2 and FIG. 3 show a series of schematic air bearing surface (ABS) view diagrams illustrating the results of forming in accord with a general embodiment of the present invention which comprises a first preferred embodiment of the present invention a magnetoresistive (MR) sensor element in accord with the present invention.

The present invention provides a method for fabricating a non-parallel magnetically biased multiple magnetoresistive (MR) layer magnetoresistive (MR) sensor element, where the non-parallel magnetically biased multiple magnetoresistive (MR) layer magnetoresistive (MR) sensor element is fabricated with optimal and enhanced magnetic properties. The method of the present invention realizes the foregoing objects by employing when forming the non-parallel magnetically biased multiple magnetoresistive (MR) layer magnetoresistive (MR) sensor element a magnetic material layer formed contacting a ferromagnetic magnetoresistive (MR) material layer, where the magnetic material layer is formed of a crystalline multiphasic magnetic material having a first crystalline phase which does not appreciably antiferromagnetically exchange couple with the ferromagnetic magnetoresistive (MR) material layer and a second crystalline phase which does appreciably antiferromagnetically exchange couple with the ferromagnetic magnetoresistive (MR) material layer. There is then annealed thermally while employing a first thermal annealing method employing an extrinsic magnetic bias field the magnetic material layer formed of the first crystalline phase to form a magnetically biased magnetic material layer formed of the first crystalline phase. There is then annealed thermally while employing a second thermal annealing method without an extrinsic magnetic bias field the magnetically biased magnetic material layer formed of the first crystalline phase to form an antiferromagnetically exchange coupled magnetically biased magnetic material layer formed of the second crystalline phase.

By employing within the method of the present invention the two step thermal annealing method, there may be employed a pair of temperatures within the two step thermal annealing method such that there is avoided when fabricating a magnetoresistive (MR) sensor element within which is formed the magnetoresistive (MR) layer degradation of other layers within the magnetoresistive (MR) sensor element.

While the present invention provides most value when forming an antiferromagnetically biased magnetoresistive (MR) layer within a non-parallel magnetically biased multiple magnetoresistive (MR) layer magnetoresistive (MR) sensor element, as is illustrated within the Description of the Preferred Embodiments which follow, the present invention may be employed in antiferromagnetically biasing magnetoresistive (MR) layers within magnetoresistive (MR) sensor elements including but not limited to single stripe magnetoresistive (SSMR) sensor elements, dual stripe magnetoresistive (DSMR) sensor elements and spin valve magnetoresistive (SVMR) sensor elements. Similarly, the present invention may also be employed in antiferromagnetically biasing magnetoresistive (MR) layers within other types of magnetoresistive (MR) sensor elements whose specific configurations and dispositions of magnetoresistive (MR) layers and antiferromagnetic biasing layers have not yet been contemplated in the art.

As is similarly understood by a person skilled in the art, a magnetoresistive (MR) sensor element, such as but not limited to a non-parallel magnetically biased multiple magnetoresistive (MR) layer magnetoresistive (MR) sensor element fabricated in accord with the Description of the Preferred Embodiments, may be employed within a magnetic sensor within magnetic sensor applications including but not limited to digital magnetic sensor applications and analog magnetic sensor applications employing magnetic heads including but not limited to magnetoresistive (MR) read only heads, merged inductive magnetic write magnetoresistive (MR) read magnetic heads and non-merged inductive magnetic write magnetoresistive (MR) read magnetic read-write heads, as employed within magnetic data storage enclosures including but not limited to direct access storage device (DASD) magnetic data storage enclosures and linear access storage device (LASD) magnetic data storage enclosures.

First Preferred Embodiment

Figure 2:
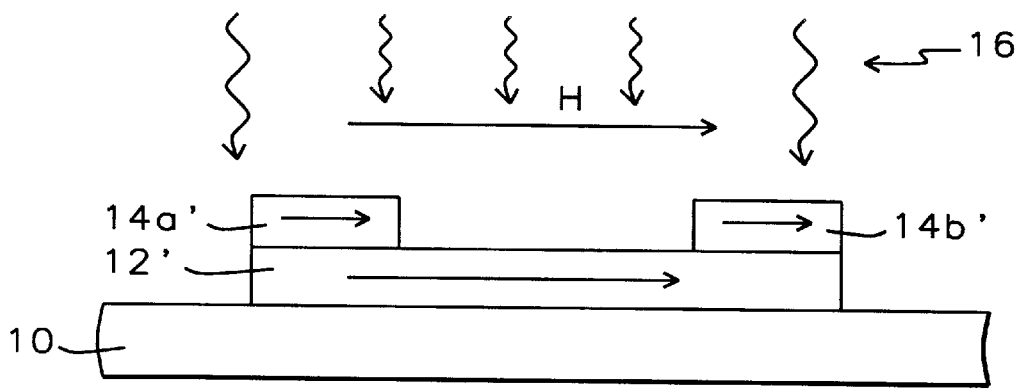
Figure 3:
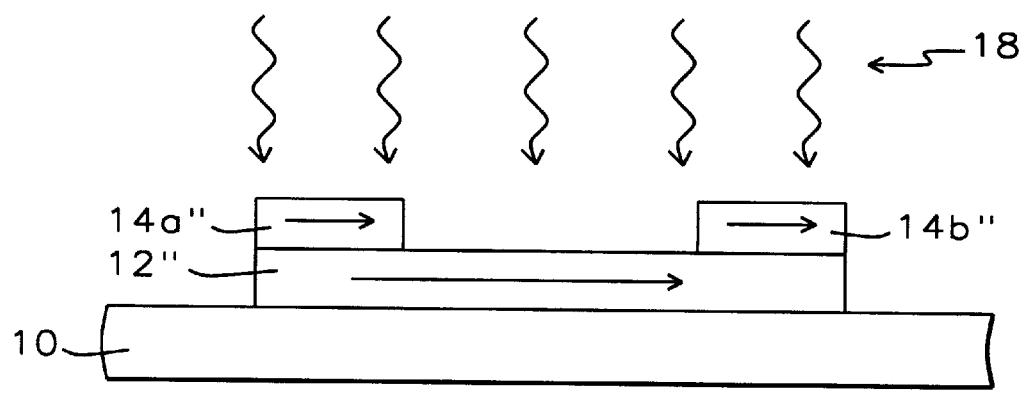

Referring now to FIG. 1 to FIG. 3, there is shown a series of schematic air bearing surface (ABS) view diagrams illustrating the results of progressive stages of fabrication in accord with a general embodiment of the present invention which comprises a first preferred embodiment of the present invention a magnetoresistive (MR) sensor element in accord with the present invention. Shown in FIG. 1 is a schematic air bearing surface (ABS) view diagram of the magnetoresistive (MR) sensor element at an early stage in its fabrication in accord with the first preferred embodiment of the present invention.

Shown in FIG. 1 is a substrate 10 having formed thereupon a magnetically unbiased patterned magnetoresistive (MR) layer 12 in turn having formed thereupon a pair of magnetically unbiased patterned longitudinal magnetic biasing layers 14a and 14b.

Within the first preferred embodiment of the present invention with respect to the substrate 10, although it is known in the art of magnetoresistive (MR) sensor element fabrication that substrates may be formed from non-magnetic ceramic materials such as but not limited to oxides, nitrides, borides and carbides, as well as homogeneous and heterogeneous mixtures of oxides, nitrides, borides and carbides, for the first preferred embodiment of the present invention, the substrate 10 is typically and preferably formed from a non-magnetic aluminum oxide/titanium carbide ceramic material. Preferably, the substrate 10 is formed with sufficient dimensions to allow the substrate 10 to be fabricated into a slider employed within a magnetic head employed within a direct access storage device (DASD) magnetic data storage enclosure employed within digitally encoded magnetic data storage and retrieval, although, as noted above, a magnetoresistive (MR) sensor element formed in accord with the present invention may be employed within other digital magnetic storage and transduction applications, as well as analog magnetic signal storage and transduction applications.

Although not specifically illustrated within the schematic air bearing surface (ABS) view diagram of FIG. 1, it is intended within the first preferred embodiment of the present invention, as well as additional embodiments of the present invention, that the substrate 10 additionally comprises any of several layers and structures as are commonly employed within a magnetic head which is formed while employing the substrate 10. Such additional layers and structures may include, but are not limited to, magnetic shield layers and structures, magnetic pole layers and structures and under-coating layers and structures.

Within the first preferred embodiment of the present invention with respect to the magnetically unbiased patterned magnetoresistive (MR) layer 12, the magnetically unbiased patterned magnetoresistive (MR) layer 12 is preferably formed of a ferromagnetic magnetoresistive (MR) material as is conventional in the art of magnetoresistive (MR) sensor element fabrication, such ferromagnetic magnetoresistive (MR) materials being selected from the general group of ferromagnetic magnetoresistive (MR) materials including but not limited to nickel-iron permalloy alloy ferromagnetic magnetoresistive (MR) materials, cobalt-iron alloy ferromagnetic magnetoresistive (MR) materials, other nickel alloy ferromagnetic magnetoresistive (MR) materials, other iron alloy ferromagnetic magnetoresistive (MR) materials, cobalt ferromagnetic magnetoresistive (MR) materials, higher order alloys thereof, composites thereof and composites of higher order alloys thereof For the first preferred embodiment of the present invention, the magnetically unbiased patterned magnetoresistive (MR) layer 12 is typically and preferably formed upon the substrate 10 from a nickel-iron (80:20; w/w) permalloy alloy ferromagnetic magnetoresistive (MR) material formed to a thickness of from about 200 to about 800 angstroms, a length (i.e. long axis or "easy" axis) of from about 0.2 to about 5 microns and a width (i.e. short axis of "hard" axis) of from about 0.1 to about 3 microns.

Finally, within the first preferred embodiment of the present invention with respect to the pair of magnetically unbiased patterned longitudinal magnetic biasing layers 14a and 14b, the pair of magnetically unbiased patterned longitudinal magnetic biasing layers 14a and 14b is formed of a crystalline multiphasic magnetic material which has at minimum: (1) a first crystalline phase which does not appreciably antiferromagnetically couple with the magnetically unbiased patterned magnetoresistive (MR) layer 12; and (2) a second crystalline phase which does appreciably antiferromagnetically couple with the magnetically unbiased patterned magnetoresistive (MR) layer 12. By "not appreciably antiferromagnetically couple" and "appreciably antiferromagnetically couple" it is intended that there exists at minimum about a ten fold difference between: (1) a first antiferromagnetic exchange field between the first crystalline phase of the magnetically unbiased patterned longitudinal magnetic biasing layers 14a and 14b in conjunction with the magnetically unbiased patterned magnetoresistive (MR) layer 12 (which approximates zero); and (2) a second antiferromagnetic exchange field between the corresponding layers when fully antiferromagnetically exchange coupled with the second crystalline phase of the magnetically unbiased patterned longitudinal magnetic biasing layers 14a and 14b.

Within the context of the first preferred embodiment of the present invention, as well as the additional embodiments of the present invention, there are several magnetic materials which possess the crystalline multiphasic characteristics which as noted above are required for the present invention. Such magnetic materials include but are not limited to nickel-manganese alloy magnetic materials (which possess a transition temperature from a non-antiferromagnetic face centered cubic (fcc) phase to an antiferromagnetic face centered tetragonal (fct) phase at about 240 degrees centigrade), platinum-manganese alloy magnetic materials (which possess a transition temperature from a non-antiferromagnetic face centered cubic (fcc) phase to an antiferromagnetic face centered tetragonal (fct) phase at about 230 degrees centigrade), platinum-palladium-manganese alloy magnetic materials and higher order alloys thereof Preferably, the pair of magnetically unbiased patterned longitudinal magnetic biasing layers 14a and 14b is formed of a nickel-manganese alloy formed to a thickness of from about 100 to about 500 angstroms upon the magnetically unbiased patterned magnetoresistive (MR) layer 12.

Referring now to FIG. 2, there is shown a schematic cross-sectional diagram illustrating the results of further processing of the magnetoresistive (MR) sensor element whose schematic cross-sectional diagram is illustrated in FIG. 1.

Shown in FIG. 2 is a schematic cross-sectional diagram of a magnetoresistive (MR) sensor element otherwise equivalent to the magnetoresistive (MR) sensor element whose schematic cross-sectional diagram is illustrated in FIG. 1, but wherein: (1) the pair of magnetically unbiased patterned longitudinal magnetic biasing layers 14a and 14b has been magnetically biased to form a pair of magnetically biased patterned longitudinal magnetic biasing layers 14a' and 14b'; and (2) the magnetically unbiased patterned magnetoresistive (MR) layer 12 has been magnetically biased to form a magnetically biased patterned magnetoresistive (MR) layer 12', incident to thermal annealing within a first thermal annealing environment 16 which employs an extrinsic magnetic bias field H.

Within the present invention and the first preferred embodiment of the present invention, the pair of magnetically unbiased patterned longitudinal magnetic biasing layers 14a and 14b is magnetically biased to form the pair of magnetically biased patterned longitudinal magnetic bias layers 14a' and 14b' and the magnetically unbiased patterned magnetoresistive (MR) layer 12 is magnetically biased to form the magnetically biased patterned magnetoresistive (MR) layer 12' within the first thermal annealing environment 16, which employs, in conjunction with the extrinsic magnetic bias field H, thermal annealing conditions which do not induce a crystalline phase change in the magnetic material from which is formed the magnetically biased patterned longitudinal magnetic biasing layers 14a' and 14b'. Such a crystalline phase change may be avoided by employing a thermal annealing temperature below the crystalline phase change temperature for the magnetic material from which is formed the magnetically biased patterned longitudinal magnetic biasing layers 14a' and 14b', or in the alternative, such a crystalline phase change may be avoided by employing a thermal annealing temperature above the crystalline phase change temperature for the magnetic material from which is formed the magnetically biased patterned longitudinal magnetic biasing layers 14a' and 14b', but for a sufficiently short time period such that crystalline phase change kinetics preclude such a crystalline phase change.

Although not specifically illustrated within the schematic air bearing surface (ABS) view diagram of FIG. 2, under either of the foregoing two options for the first thermal annealing environment 16 there is not obtained any antiferromagnetic coupling between the pair of magnetically biased patterned longitudinal magnetic biasing layers 14a' and 14b' and the magnetically biased patterned magnetoresistive (MR) layer 12', since there is avoided a pertinent crystalline phase change when forming from the magnetically unbiased patterned longitudinal magnetic biasing layers 14a and 14b the pair of magnetically biased patterned longitudinal magnetic biasing layers 14a' and 14b'.

Thus, for example, within the first preferred embodiment of the present when the pair of magnetically biased patterned longitudinal magnetic biasing layers 14a' and 14b' is formed of a nickel-manganese alloy magnetic material which has the crystalline phase transition temperature of about 240 degrees centigrade, there is typically preferably employed either: (1) a lower temperature thermal annealing method which employs a thermal annealing temperature of from about 200 to about 230 degrees centigrade for a time period of from about 3 to about 5 hours at the extrinsic magnetic bias field H of from about 150 to about 300 oersteds, or in the alternative; (2) a higher temperature thermal annealing method which employs a thermal annealing temperature of from about 250 to about 270 degrees centigrade for a time period of from about 20 to about 40 minutes at the extrinsic magnetic bias field H of from about 150 to about 300 oersteds.

Referring now to FIG. 3, there is shown a schematic air bearing surface (ABS) view diagram illustrating the results of further processing of the magnetoresistive (MR) sensor element whose schematic air bearing surface (ABS) view diagram is illustrated in FIG. 2.

Shown in FIG. 3 is a schematic air bearing surface (ABS) view diagram of a magnetoresistive (MR) sensor element otherwise equivalent to the magnetoresistive (MR) sensor element whose schematic air bearing surface (ABS) view diagram is illustrated in FIG. 3, but wherein: (1) the pair of magnetically biased patterned longitudinal magnetic biasing layers 14a' and 14b'; and (2) the magnetically biased patterned magnetoresistive (MR) layer 12' have been thermally annealed within a second thermal annealing environment 18 without an extrinsic magnetic bias field to form: (1) a corresponding pair of antiferromagnetically coupled magnetically biased patterned longitudinal magnetic biasing layers 14a" and 14b"; and (2) a corresponding antiferromagnetically coupled magnetically biased patterned magnetoresistive (MR) Layer 12". Due to the antiferromagnetic coupling between the pair of antiferromagnetically coupled magnetically biased patterned longitudinal magnetic biasing layers 14a" and 14b" and the antiferromagnetically coupled magnetically biased patterned magnetoresistive (MR) Layer 12", there is provided an exchange bias field between the foregoing layers.

Within the first preferred embodiment of the present invention and the additional preferred embodiments of the present invention, the second thermal annealing environment 18 employs a second thermal annealing temperature greater than a crystalline transition temperature of the magnetic material from which is formed the antiferromagnetically coupled magnetically biased patterned longitudinal magnetic biasing layers 14a" and 14b", where the second thermal annealing temperature is preferably employed for a second thermal annealing time period sufficiently long such that an optimally high exchange bias field is developed between the pair of antiferromagnetically coupled magnetically biased patterned longitudinal magnetic biasing layers 14a" and 14b" and the antiferromagnetically coupled magnetically biased patterned magnetoresistive (MR) layer 12", while not otherwise thermally degrading any other layers or structures within magnetoresistive (MR) sensor element whose schematic air bearing surface (ABS) view diagram is illustrated in FIG. 3.

For example and without limitation, when the pair of antiferromagnetically coupled magnetically biased patterned longitudinal magnetic biasing layers 14a" and 14b" is formed of a nickel-manganese magnetic material, the second thermal annealing environment 18 preferably employs a second thermal annealing temperature of from about 250 to about 280 degrees centigrade for a second thermal annealing time period of from about 5 to about 10 hours.

Upon forming the magnetoresistive (MR) sensor element whose schematic air bearing surface (ABS) view diagram is illustrated in FIG. 3, there is formed a magnetoresistive (MR) sensor element with enhanced antiferromagnetic exchange bias, and thus enhanced magnetic properties. The magnetoresistive (MR) sensor element whose schematic air bearing surface (ABS) view diagram is illustrated in FIG. 3 realizes the foregoing objects by employing when forming the magnetoresistive (MR) sensor element a two step thermal annealing method wherein: (1) a first thermal annealing step within the two step thermal annealing method generally employs a lower temperature in conjunction with an extrinsic magnetic bias field in order to magnetically bias a magnetically unbiased patterned magnetoresistive (MR) layer and a pair of magnetically unbiased patterned longitudinal magnetic biasing layers while not degrading magnetic properties of other structures or layers within the magnetoresistive (MR) sensor element, followed by; (2) a second thermal annealing step within the two step thermal annealing method in absence of an extrinsic magnetic bias field for antiferromagnetically coupling the pair of magnetically biased patterned longitudinal magnetic biasing layers with the magnetically biased patterned magnetoresistive (MR) layer.

Second Preferred Embodiment

Figure 4:
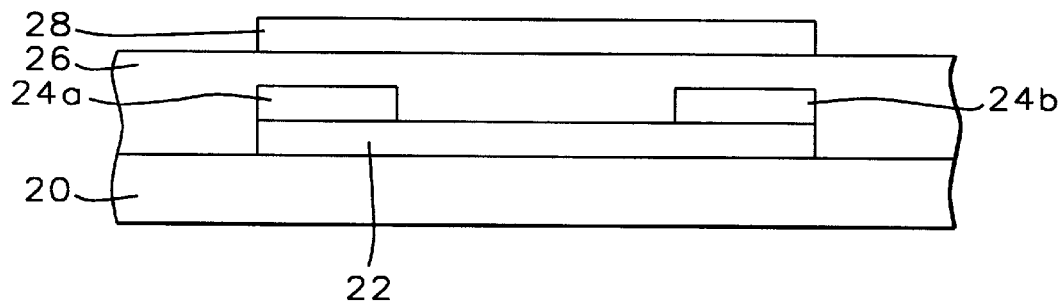
FIG. 4, FIG. 5, FIG. 6, FIG. 7 and FIG. 8 show a series of schematic air bearing surface (ABS) view diagrams illustrating the results of forming in accord with a more specific embodiment of the present invention which comprises a second preferred embodiment of the present invention a dual stripe magnetoresistive (DSMR) sensor element in accord with the present invention.

Referring now to FIG. 4 to FIG. 8, there is shown a series of schematic air bearing surface (ABS) view diagrams illustrating the results of progressive stages of forming in accord with a more specific embodiment of the present invention which comprises a second preferred embodiment of the present invention a dual stripe magnetoresistive (DSMR) sensor element in accord with the present invention. Shown in FIG. 4 is a schematic air bearing surface (ABS) view diagram illustrating the dual stripe magnetoresistive (DSMR) sensor element at an early stage in its fabrication in accord with the second preferred embodiment of the present invention.

Shown in FIG. 4, in a first instance, is a substrate 20 having formed thereupon a magnetically unbiased patterned first magnetoresistive (MR) layer 22, in turn having formed thereupon a pair of magnetically unbiased patterned first longitudinal magnetic biasing layers 24a and 24b.

Within the second preferred embodiment of the present invention with respect to the substrate 20, the substrate 20 is typically and preferably formed employing methods, materials and dimensions analogous or equivalent to the methods, materials and dimensions employed for forming the substrate 10 within the first preferred embodiment of the present invention as illustrated within the schematic air bearing surface (ABS) view diagrams of FIG. 1 to FIG. 3.

Similarly, within the second preferred embodiment of the present invention with respect to the magnetically unbiased patterned first magnetoresistive (MR) layer 22, the magnetically unbiased patterned first magnetoresistive (MR) layer 22 is typically and preferably formed employing methods, materials and dimensions analogous or equivalent to the methods, materials and dimensions employed for forming the magnetically unbiased patterned magnetoresistive (MR) layer 12 within the first preferred embodiment of the present invention, as illustrated within the schematic air bearing surface (ABS) view diagram of FIG. 1.

Finally, within the second preferred embodiment of the present invention with respect to the pair of magnetically unbiased patterned first longitudinal magnetic biasing layers 24a and 24b, the pair of magnetically unbiased patterned first longitudinal magnetic biasing layers 24a and 24b is typically and preferably formed employing methods, materials and dimensions analogous or equivalent to the methods, materials and dimensions employed for forming the pair of magnetically unbiased patterned longitudinal magnetic biasing layers 14a and 14b within the first preferred embodiment of the present invention, as is similarly also illustrated within the schematic air bearing surface (ABS) view diagram of FIG. 1.

Shown also within the schematic air bearing surface (ABS) view diagram of FIG. 4 is a blanket inter-stripe dielectric layer 26 formed upon and covering portions of the substrate 20, the magnetically unbiased patterned first magnetoresistive (MR) layer 22 and the magnetically unbiased patterned first longitudinal magnetic biasing layers 24a and 24b, where the blanket inter-stripe dielectric layer in turn has formed thereupon a magnetically unbiased patterned second magnetoresistive (MR) layer 28.

Within the second preferred embodiment of the present invention with respect to the blanket inter-stripe dielectric layer 26, the blanket inter-stripe dielectric layer 26 may be formed employing methods and materials as are conventionally employed for forming dielectric layers within magnetoresistive (MR) sensor elements, such methods including but not limited to chemical vapor deposition (CVD) methods, plasma enhanced chemical vapor deposition (PECVD) methods and physical vapor deposition (PVD) methods through which may be formed dielectric layers from dielectric materials including but not limited to silicon oxide dielectric materials, silicon nitride dielectric materials and aluminum oxide dielectric materials. For the second preferred embodiment of the present invention, the blanket inter-stripe dielectric layer 26 is typically and preferably formed of an aluminum oxide dielectric material deposited employing a physical vapor deposition (PVD) method, as is conventional in the art of magnetoresistive (MR) sensor element fabrication. Typically and preferably, the blanket inter-stripe dielectric layer 26 is formed to a thickness of from about 100 to about 800 angstroms.

Finally within the second preferred embodiment of the present invention with respect to the magnetically unbiased patterned second magnetoresistive (MR) layer 28, the magnetically unbiased patterned second magnetoresistive (MR) layer 28 is typically and preferably formed employing methods, materials and dimensions analogous or equivalent to the methods, materials and dimensions employed for forming the magnetically unbiased patterned first magnetoresistive (MR) layer 22. Typically and preferably, the magnetically unbiased patterned first magnetoresistive (MR) layer 22 and the magnetically unbiased patterned second magnetoresistive (MR) layer 28 are formed of a single magnetoresistive (MR) material.

Figure 5:
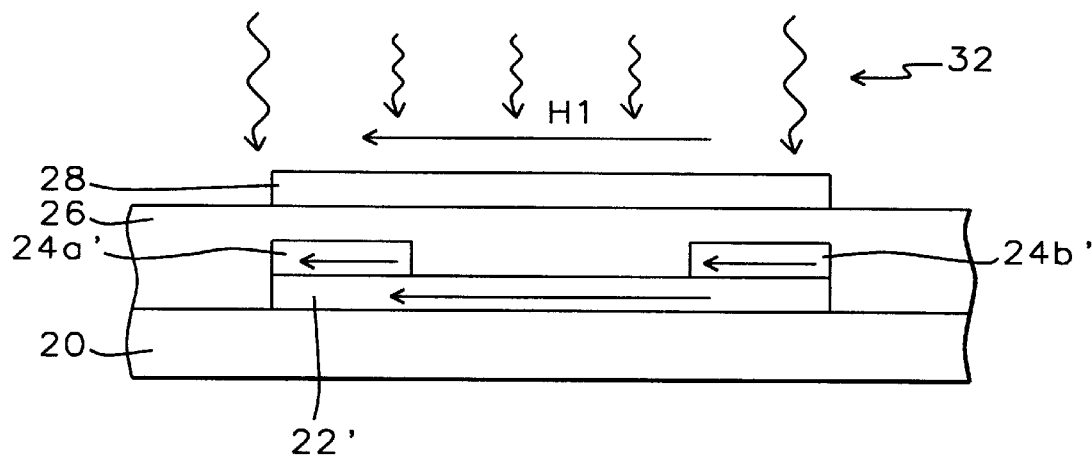

Referring now to FIG. 5, there is shown a schematic air bearing surface (ABS) view diagram illustrating the results of further processing of the dual stripe magnetoresistive (DSMR) sensor element whose schematic air bearing surface (ABS) view diagram is illustrated in FIG. 4.

Shown in FIG. 5 is a schematic air bearing surface (ABS) view diagram of a dual stripe magnetoresistive (DSMR) sensor element otherwise equivalent to the dual stripe magnetoresistive (DSMR) sensor element whose schematic air bearing surface (ABS) view diagram is illustrated in FIG. 4, but wherein the dual stripe magnetoresistive (DSMR) sensor element is thermally annealed within a first thermal annealing environment 32 while employing a first thermal annealing temperature, a first thermal annealing exposure time and a first extrinsic magnetic bias field H1 which magnetically biases the pair of magnetically unbiased patterned first longitudinal magnetic biasing layers 24a and 24b to form a pair of antiferromagnetically coupled magnetically biased patterned first longitudinal magnetic biasing layers 24a' and 24b' which are simultaneously antiferromagnetically coupled to an antiferromagnetically coupled magnetically biased patterned first magnetoresistive (MR) layer 22' which is formed from the magnetically unbiased patterned first magnetoresistive (MR) layer 22.

Within the first preferred embodiment of the present invention with respect to the first thermal annealing environment 32, the first thermal annealing environment 32 is typically and preferably provided while employing a first thermal annealing temperature, a first thermal annealing exposure time and the first extrinsic magnetic bias field H1 which provides for complete antiferromagnetic coupling between the pair of antiferromagnetically coupled magnetically biased patterned first longitudinal magnetic biasing layers 24a' and 24b' and the antiferromagnetically coupled magnetically biased patterned first magnetoresistive (MR) layer 22'.

Thus, for example, within the second preferred embodiment of the present invention when the pair of magnetically unbiased patterned first longitudinal magnetic biasing layers 24a and 24b is formed of a nickel-manganese alloy antiferromagnetic longitudinal magnetic biasing material which has an antiferromagnetic transition temperature of about 240 degrees centigrade, the first thermal annealing method typically and preferably employs: (1) a first thermal annealing temperature of from about 240 to about 330 degrees centigrade; (2) a first thermal annealing exposure time of from about 1 to about 15 hours; and (3) a first extrinsic magnetic bias field H1 of from about 400 to about 3000 oersteds.

Although the air bearing surface (ABS) view diagram of FIG. 5 illustrates the magnetically unbiased patterned second magnetoresistive (MR) layer 28 as present when forming the pair of antiferromagnetically coupled magnetically biased patterned first longitudinal magnetic biasing layers 24a' and 24b' and the antiferromagnetically coupled magnetically biased patterned first magnetoresistive (MR) layer 22', such is not required within all process schemes which may be employed for forming the dual stripe magnetoresistive (DSMR) sensor element whose schematic air bearing surface (ABS) view diagram is illustrated in FIG. 5.

Figure 6:
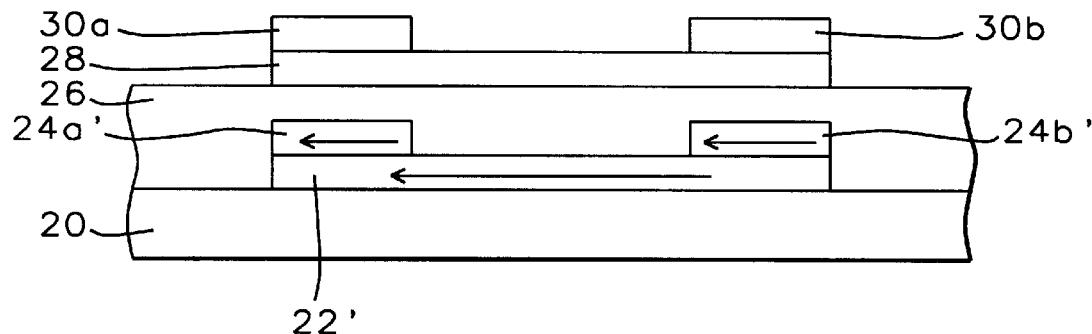

Referring now to FIG. 6, there is shown a schematic air bearing surface (ABS) view diagram illustrating the results of further processing of the dual stripe magnetoresistive (DSMR) sensor element whose schematic air bearing surface (ABS) view diagram is illustrated in FIG. 5.

Shown in FIG. 6 is a schematic air bearing surface (ABS) view diagram of a dual stripe magnetoresistive (DSMR) sensor element otherwise equivalent to the dual stripe magnetoresistive (DSMR) sensor element whose schematic air bearing surface (ABS) view diagram is illustrated in FIG. 5, but wherein there is formed upon the magnetically unbiased patterned second magnetoresistive (MR) layer 28 a pair of magnetically unbiased patterned second longitudinal magnetic biasing layers 30a and 30b.

Within the second preferred embodiment of the present invention, the pair of magnetically unbiased patterned second longitudinal magnetic biasing layers 30a and 30bis typically and preferably formed employing methods, materials and dimensions analogous or equivalent to the methods, materials and dimensions employed for forming the pair of magnetically unbiased patterned first longitudinal magnetic biasing layers 24a and 24b. More preferably, the pair of magnetically unbiased patterned second longitudinal magnetic biasing layers 30a and 30b, and the pair of magnetically biased patterned first longitudinal magnetic biasing layers 24a and 24b are formed of a single antiferromagnetic longitudinal magnetic biasing material.

Figure 7:
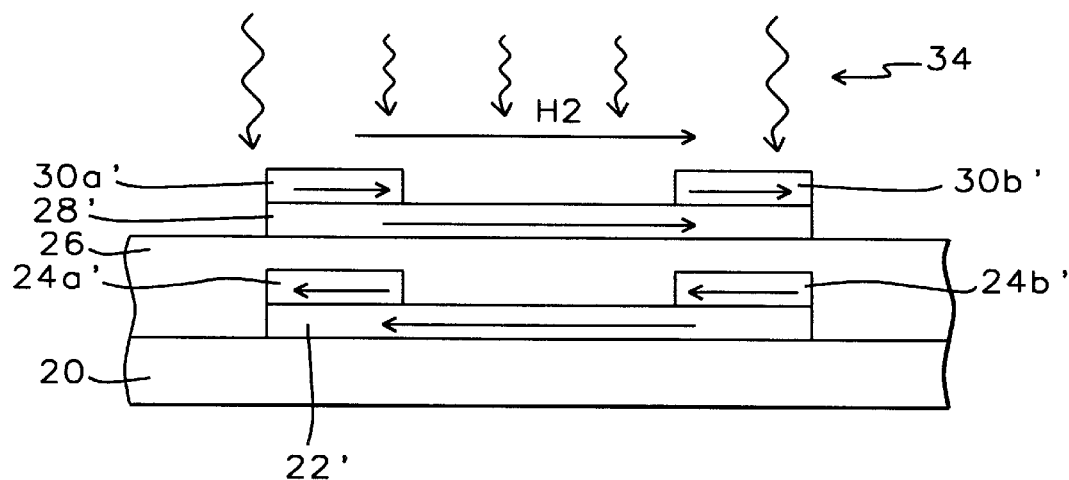

Referring now to FIG. 7, there is shown a schematic air bearing surface (ABS) view diagram illustrating the results of further processing of the dual stripe magnetoresistive (DSMR) sensor element whose schematic air bearing surface (ABS) view diagram is illustrated in FIG. 6.

Shown in FIG. 7 is a schematic air bearing surface (ABS) view diagram of a dual stripe magnetoresistive (DSMR) sensor element otherwise equivalent to the dual stripe magnetoresistive (DSMR) sensor element whose schematic air bearing surface (ABS) view diagram is illustrated in FIG. 6, but wherein the dual stripe magnetoresistive (DSMR) sensor element has been thermally annealed within a second thermal annealing environment 34, while employing a second extrinsic magnetic bias field H2 nominally anti-parallel (typically anti-parallel within a skew of from about −10 to about +10 degrees from purely anti-parallel) to the first magnetic bias field H1 as illustrated within the schematic air bearing surface view diagram of FIG. 5, to thus: (1) form from the pair of magnetically unbiased patterned second longitudinal magnetic biasing layers 30a and 30b a pair of magnetically biased patterned second longitudinal magnetic biasing layers 30a' and 30b'; and (2) form from the magnetically unbiased patterned second magnetoresistive (MR) layer 28 a magnetically biased patterned second magnetoresistive (MR) layer 28'. Within the second preferred embodiment of the present invention, the second thermal annealing environment 34 is preferably provided employing methods, materials and conditions analogous or equivalent to the methods, materials and conditions employed for providing the first thermal annealing environment 16 employed within the first preferred embodiment of the present invention as illustrated within the schematic air bearing surface (ABS) view diagram of FIG. 2.

As is understood by a person skilled in the art, although the schematic air bearing surface (ABS) view diagram of FIG. 7 illustrates the second extrinsic magnetic bias field H2 as being nominally antiparallel to the first extrinsic magnetic bias field H1 as illustrated within the schematic air bearing surface (ABS) view diagram of FIG. 5, for alternative designs of dual stripe magnetoresistive (DSMR) sensor elements alternative non-parallel dispositions of a second extrinsic magnetic bias field (such as the second extrinsic magnetic bias field H2) may be provided with respect to a first extrinsic magnetic bias field (such as the first extrinsic magnetic bias field H1).

Figure 8:
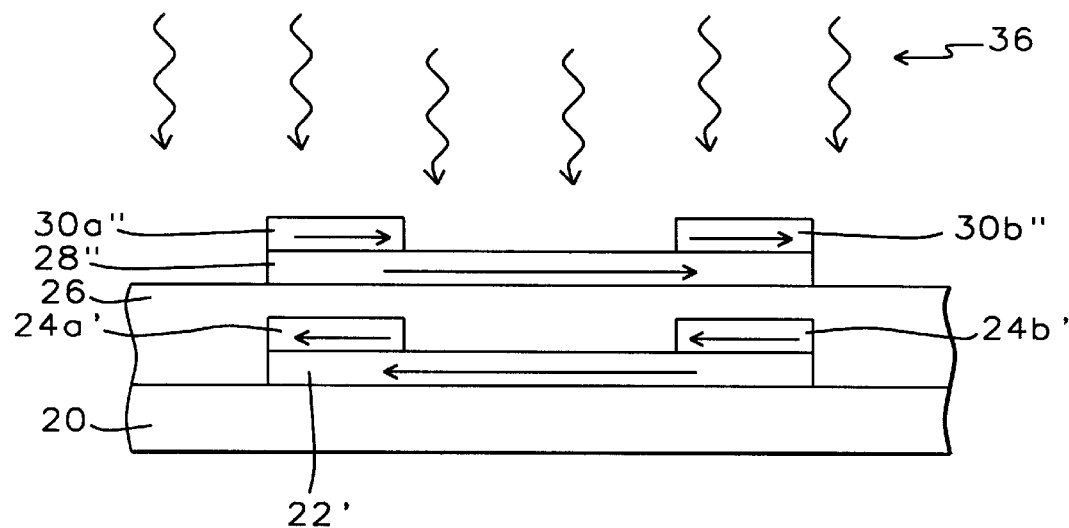

Referring now to FIG. 8, there is shown a schematic air bearing surface (ABS) view diagram illustrating the results of further processing of the dual stripe magnetoresistive (DSMR) sensor element whose schematic air bearing surface (ABS) view diagram is illustrated in FIG. 7.

Shown in FIG. 8 is a schematic air bearing surface (ABS) view diagram of a dual stripe magnetoresistive (DSMR) sensor element otherwise equivalent to the dual stripe magnetoresistive (DSMR) sensor element whose schematic air bearing surface (ABS) view diagram is illustrated in FIG. 7, but wherein: (1) the magnetically biased patterned second longitudinal magnetic biasing layers 30a' and 30b' have been transformed to form a pair of antiferromagnetically coupled magnetically biased patterned second longitudinal magnetic biasing layers 30a" and 30b"; and (2) the magnetically biased patterned second magnetoresistive (MR) layer 28' has been transformed to form an antiferromagnetically coupled magnetically biased patterned second magnetoresistive (MR) layer 28", incident to annealing the dual stripe magnetoresistive (DSMR) sensor element whose schematic air bearing surface (ABS) view diagram is illustrated in FIG. 7 within a third thermal annealing environment 36, without an extrinsic magnetic bias field.

Within the second preferred embodiment of the present invention, the third thermal annealing environment 36 is preferably formed employing methods, materials and conditions analogous or equivalent to the methods, materials and conditions employed for forming the second thermal annealing environment 18 within the first preferred embodiment of the present invention as illustrated within the schematic air bearing surface (ABS) view diagram of FIG. 3.

Upon forming the dual stripe magnetoresistive (DSMR) sensor element whose schematic air bearing surface (ABS) view diagram is illustrated in FIG. 8, there is formed a dual stripe magnetoresistive (DSMR) sensor element, which for reasons as outlined with respect to the first preferred embodiment of the present invention possesses optimal and enhanced magnetic properties.

Third Preferred Embodiment

Figure 9:
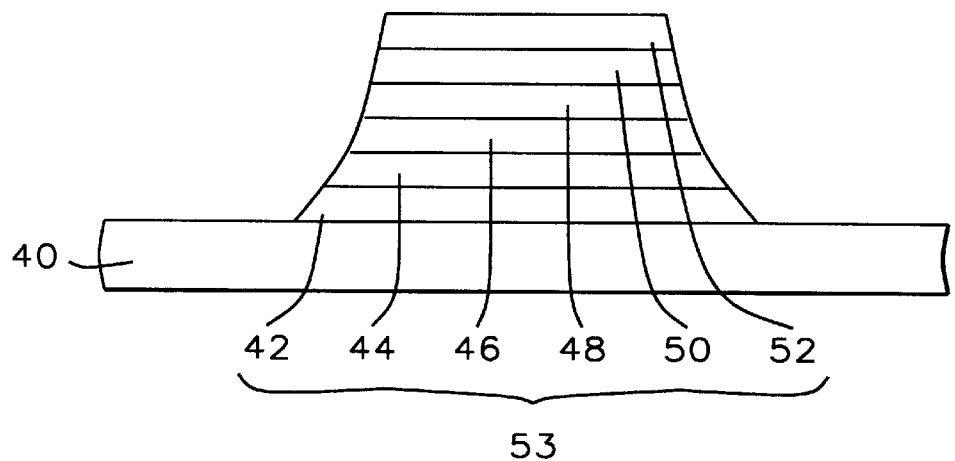
FIG. 9, FIG. 10, FIG. 11, FIG. 12 and FIG. 13 show a series of schematic air bearing surface (ABS) view diagrams illustrating the results of forming in accord with a more specific embodiment of the present invention which comprises a third preferred embodiment of the present invention a spin valve magnetoresistive (SVMR) sensor element in accord with the present invention.

Referring now to FIG. 9 to FIG. 13, there is shown a series of schematic air bearing surface (ABS) view diagrams illustrating the results of forming in accord with a more specific embodiment of the present invention which comprises a third preferred embodiment of the present invention a spin valve magnetoresistive (SVMR) sensor element in accord with the present invention. Shown in FIG. 9 is a schematic air bearing surface (ABS) view diagram of the spin valve magnetoresistive (SVMR) sensor element at an early stage in its fabrication in accord with the third preferred embodiment of the present invention.

Shown in FIG. 9 is a substrate 40 having formed thereover, among other layers, a seed layer 42, which in turn has formed thereupon a magnetically unbiased ferromagnetic free layer 44, which it turn has formed thereupon a non-magnetic conductor spacer layer 46, which in turn has formed thereupon a magnetically unbiased ferromagnetic pinned layer 48, which it turn has formed thereupon a magnetically unbiased pinning material layer 50, which finally in turn has formed thereupon a capping layer 52, wherein the aggregate of the foregoing layers forms a spin valve magnetoresistive (SVMR) stack layer 53.

Within the third preferred embodiment of the present invention with respect to the substrate 40, the substrate 40 is preferably formed employing methods, materials and dimensions analogous or equivalent to the methods, materials and dimensions employed for forming the substrate 20 within the dual stripe magnetoresistive (DSMR) sensor element whose schematic air bearing surface (ABS) view diagram is illustrated in FIG. 4 to FIG. 8 or the substrate 10 within the magnetoresistive (MR) sensor element whose schematic air bearing surface (ABS) view diagram is illustrated in FIG. 1 to FIG. 3.

Similarly, within the third preferred embodiment of the present invention with respect to the seed layer 42, although the seed layer 42 is optional within the third preferred embodiment of the present invention, the seed layer 42 is preferably formed of a seed material which facilitates forming the magnetically unbiased ferromagnetic free layer 44 upon the seed layer 42. Typically and preferably, the seed layer 42 is formed to a thickness of from about 10 to about 100 angstroms.

Similarly, within the third preferred embodiment of the present invention with respect to the magnetically unbiased ferromagnetic free layer 44 and the magnetically unbiased ferromagnetic pinned layer 48, each of the magnetically unbiased ferromagnetic free layer 44 and the magnetically unbiased ferromagnetic pinned layer 48 is formed of a ferromagnetic material, preferably a single ferromagnetic material, analogous or equivalent to the ferromagnetic magnetoresistive (MR) materials from which are formed: (1) the magnetically unbiased patterned first magnetoresistive (MR) layer 22 and the magnetically unbiased patterned second magnetoresistive (MR) layer 28 within the second preferred embodiment of the present invention as illustrated within the schematic air bearing surface (ABS) view diagram of FIG. 4; and (2) the magnetically unbiased patterned magnetoresistive (MR) layer 12 within the first preferred embodiment of the present invention as illustrated within the schematic air bearing surface (ABS) view diagram of FIG. 1. Typically and preferably, the magnetically unbiased ferromagnetic free layer 44 is formed to a thickness of from about 10 to about 110 angstroms while the magnetically unbiased ferromagnetic pinned layer 48 is formed to a thickness of from about 5 to about 80 angstroms.

In addition, within the third preferred embodiment of the present invention with respect to the non-magnetic conductor spacer layer 46, the non-magnetic conductor spacer layer 46 may be formed of non-magnetic conductor materials as are conventional in the art of spin valve magnetoresistive (SVMR) sensor element fabrication, including but not limited to gold, gold alloy, silver, silver alloy, copper and copper alloy non-magnetic conductor spacer materials. For the third preferred embodiment of the present invention, the non-magnetic conductor spacer layer 46 is preferably formed of a copper containing non-magnetic conductor spacer material formed to a thickness of from about 10 to about 50 angstroms upon the magnetically unbiased ferromagnetic free layer 44.

In addition, within the third preferred embodiment of the present invention with respect to the magnetically unbiased pinning material layer 50, the magnetically unbiased pinning material layer 50 is formed of an antiferromagnetic pinning material generally equivalent to the antiferromagnetic material from which is formed the magnetically unbiased longitudinal magnetic biasing layers 14a and 14b as employed within the first preferred embodiment of the present invention as illustrated within the schematic cross-sectional diagram of FIG. 1. Preferably, the magnetically unbiased pinning material layer 50 is formed to a thickness of from about 50 to about 300 angstroms.

Finally, within the third preferred embodiment of the present invention with respect to the capping layer 52, it is known in the art of spin valve magnetoresistive (SVMR) sensor element fabrication that capping layers may be formed of non-magnetic conductor materials generally analogous to the non-magnetic conductor materials employed for forming non-magnetic conductor spacer layers within spin valve magnetoresistive (SVMR) sensor elements, but where such capping layers are generally formed of non-magnetic conductor materials of higher resistivity in order to limit current shunting through the capping layer. Such non-magnetic conductor materials of higher resistivity include, but are not limited to, tantalum non-magnetic conductor materials. Thus, for the preferred embodiment of the present invention the capping layer 52 is preferably formed of a tantalum non-magnetic conductor material formed to a thickness of from about 10 to about 100 angstroms upon the magnetically unbiased pinning material layer 50. Within the present invention, the capping layer 52 may alternatively be formed of a material analogous or equivalent to a material from which is formed the seed layer 42.

Although the capping layer 52 is optional within the spin-valve magnetoresistive (SVMR) sensor element whose schematic air bearing surface (ABS) view diagram is illustrated in FIG. 9, the capping layer 52 typically provides a barrier which impedes environmental degradation of underlying layers within the spin-valve magnetoresistive (SVMR) sensor element whose schematic air bearing surface (ABS) view diagram is illustrated in FIG. 9.

Figure 10:
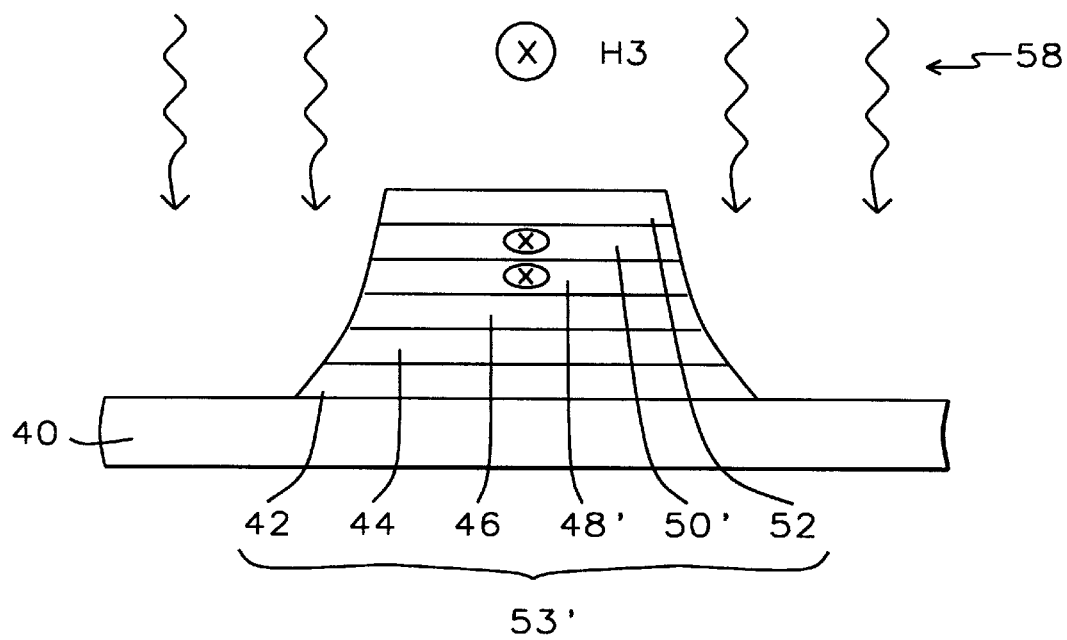

Referring now to FIG. 10, there is shown a schematic air bearing surface (ABS) view diagram illustrating the results of further processing of the spin valve magnetoresistive (SVMR) sensor element whose schematic air bearing surface (ABS) view diagram is illustrated in FIG. 9.

Shown in FIG. 10 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram illustrated in FIG. 9, but wherein the spin valve magnetoresistive (SVMR) sensor element has been thermally annealed within a first thermal annealing environment 58 while employing a first thermal annealing method employing a first extrinsic magnetic bias field H3 perpendicular to the air bearing surface (ABS) of the spin valve magnetoresistive (SVMR) sensor element to magnetically bias the magnetically unbiased pinning material layer 50 and form a magnetically biased pinning material layer 50' while simultaneously magnetically biasing the magnetically unbiased ferromagnetic pinned layer 48 to form a magnetically biased ferromagnetic pinned layer 48', thus forming from the spin valve magnetoresistive (SVMR) stack layer 53 a once thermally annealed spin valve magnetoresistive (SVMR) stack layer 53'.

Within the third preferred embodiment of the present invention, the first thermal annealing environment 58 is preferably provided employing methods, materials and conditions analogous or equivalent to the methods, materials and conditions employed when providing the first thermal annealing environment 32 within the second preferred embodiment of the present invention, as illustrated within the schematic air bearing surface (ABS) view diagram of FIG. 5.

Figure 11:
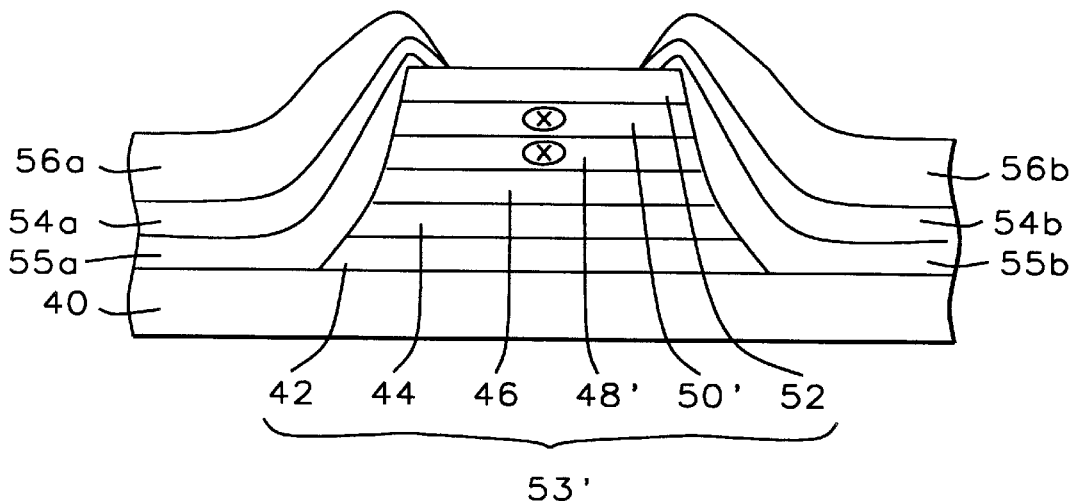

Referring now to FIG. 11, there is shown a schematic air bearing surface view diagram illustrating the results of further processing of the spin valve magnetoresistive (SVMR) sensor element whose schematic air bearing surface (ABS) view diagram is illustrated in FIG. 10.

Shown in FIG. 11 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated within FIG. 10, but wherein there is formed adjoining a pair of opposite edges of the once thermally annealed spin valve magnetoresistive (SVMR) stack layer 53': (1) a pair of magnetically unbiased ferromagnetic liner layers 55a and 55b, having formed and aligned thereupon; (2) a pair of magnetically unbiased longitudinal magnetic biasing layers 54a and 54b, in turn having formed and aligned thereupon; (3) a pair of patterned conductor lead layers 56a and 56b.

Within the third preferred embodiment of the present invention: (1) the pair of magnetically unbiased ferromagnetic liner layers 55a and 55b is preferably formed employing methods and materials analogous or equivalent to the methods and materials employed for forming the magnetically unbiased ferromagnetic pinned layer 48 as illustrated within the schematic air bearing surface (ABS) view diagram of FIG. 9; and (2) the pair of magnetically unbiased longitudinal magnetic biasing layers 54a and 54b is preferably formed employing methods and materials analogous or equivalent to the methods and materials which are employed for forming the magnetically unbiased pinning material layer 50 as is illustrated within the schematic air bearing surface (ABS) view diagram of FIG. 9. Typically and preferably, the pair of magnetically unbiased ferromagnetic liner layers 55a and 55b and the pair of magnetically unbiased longitudinal magnetic biasing layers 54a and 54b are formed to a thickness of from about 100 to about 800 angstroms, in the aggregate, per laminated pair.

Similarly, within the third preferred embodiment of the present invention with respect to the pair of conductor lead layers 56a and 56b, the pair of conductor lead layers 56a and 56b is formed of a conductor lead material as is conventional in the art of magnetoresistive (MR) sensor element fabrication, such conductor lead materials including but not limited to gold, gold alloy, copper, copper alloy, silver, silver alloy, tantalum and tantalum alloy conductor lead materials. Typically and preferably, the pair of conductor lead layers 56a and 56b is formed of a laminate of a gold alloy and a tantalum alloy conductor material, formed to a thickness of from about 100 to about 1000 angstroms upon the magnetically unbiased longitudinal magnetic bias layers 54a and 54b.

Figure 12:
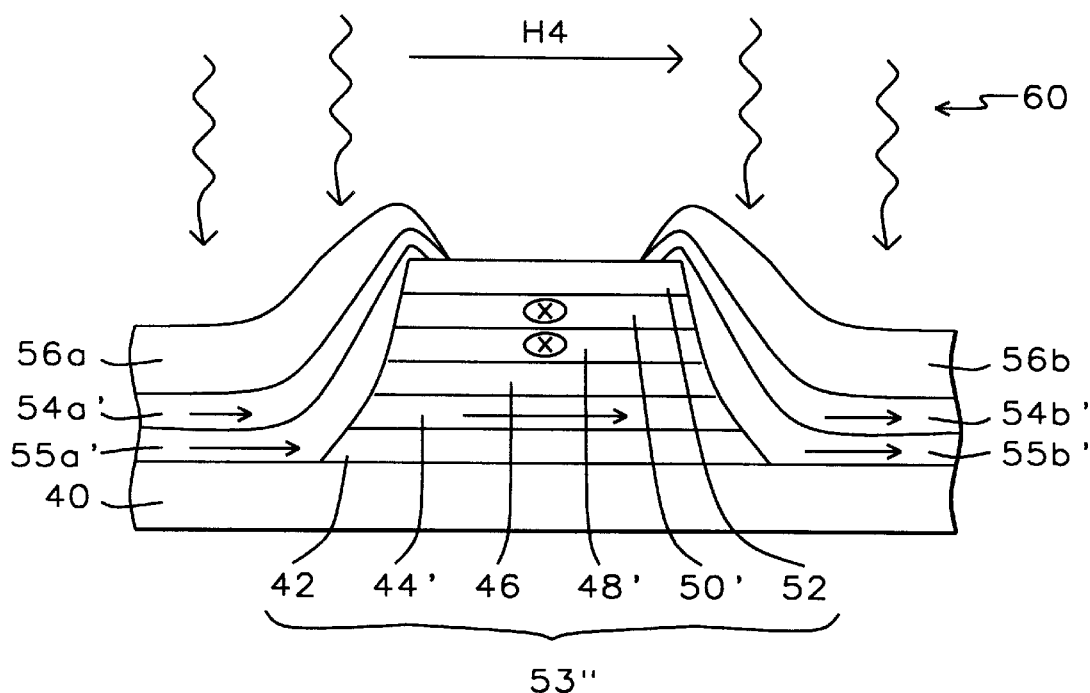

Referring now to FIG. 12, there is shown a schematic air bearing surface (ABS) view diagram illustrating the results of further processing of the spin valve magnetoresistive (SVMR) sensor element whose schematic air bearing surface (ABS) view diagram is illustrated in FIG. 11.

Shown in FIG. 12 is a schematic air bearing surface (ABS) view diagram of a spin valve magnetoresistive (SVMR) sensor element otherwise equivalent to the spin valve magnetoresistive (SVMR) sensor whose schematic air bearing surface (ABS) view diagram is illustrated in FIG. 11, but wherein the pair of magnetically unbiased ferromagnetic liner layers 55a and 55b and the pair of magnetically unbiased longitudinal magnetic biasing layers 54a and 54b have been magnetically biased incident to thermal annealing within a second thermal annealing environment 60 in the presence of a second extrinsic magnetic bias field H4 nominally perpendicular to the first extrinsic magnetic bias field H3 (typically within a skew from purely perpendicular of from about −10 to about +10 degrees) to form a corresponding pair of magnetically biased ferromagnetic liner layers 55a' and 55b' and a corresponding pair of magnetically biased longitudinal magnetic biasing layers 54a' and 54b', which simultaneously magnetically bias and magnetically couple the magnetically unbiased ferromagnetic free layer 44 to form the magnetically biased ferromagnetic free layer 44', and thus form from the once thermally annealed spin valve magnetoresistive (SVMR) stack layer 53' a twice thermally annealed spin valve magnetoresistive (SVMR) stack layer 53".

Within the third preferred embodiment of the present invention, the second thermal annealing environment 60 is provided employing methods, materials and conditions analogous or equivalent to the methods, materials and conditions employed when providing the second thermal annealing environment 34 within the second preferred embodiment of the present invention as illustrated within the schematic air bearing surface (ABS) view diagram of FIG. 7 or the first thermal annealing environment 16 within the first preferred embodiment of the present invention as illustrated within the schematic air bearing surface (ABS) view diagram of FIG. 2.

Figure 13:
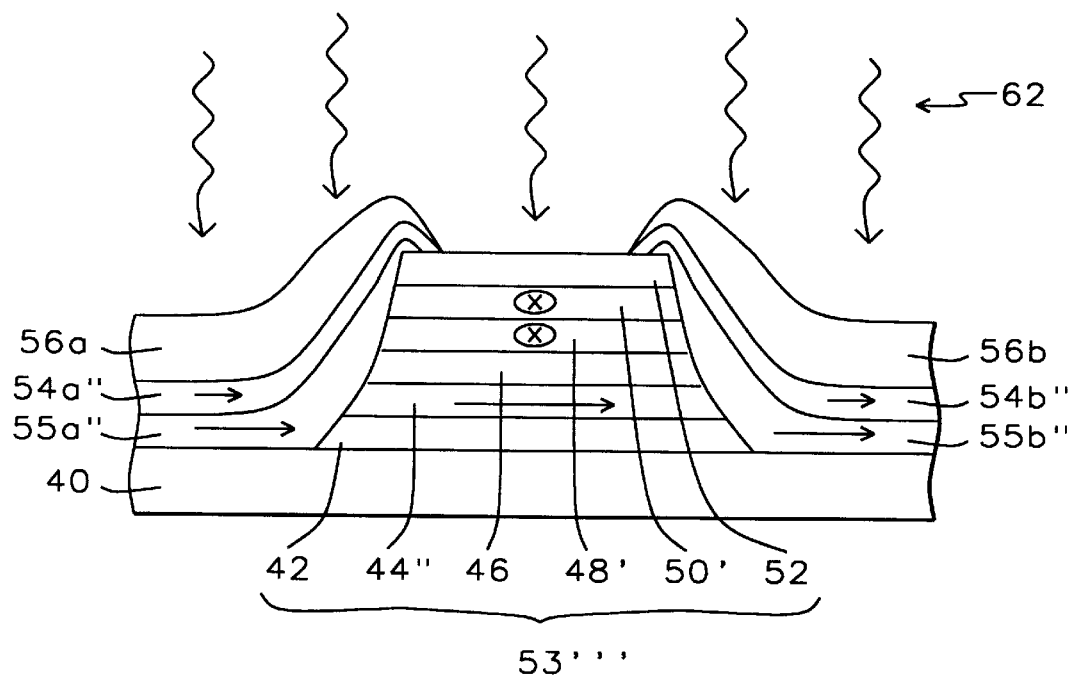

Referring now to FIG. 13, there is shown a schematic air bearing surface (ABS) view diagram illustrating the results of further processing of the spin valve magnetoresistive (SVMR) sensor element whose schematic air bearing surface (ABS) view diagram is illustrated within FIG. 12.

Shown in FIG. 13 is a schematic air bearing surface (ABS) view diagram of a spin valve magnetoresistive (SVMR) sensor element otherwise equivalent to the spin valve magnetoresistive (SVMR) sensor element whose schematic air bearing surface (ABS) view diagram is illustrated in FIG. 12, but wherein: (1) the pair of magnetically biased ferromagnetic liner layers 55a' and 55b' is transformed into a pair of antiferromagnetically coupled magnetically biased ferromagnetic liner layers 55a" and 55b"; (2) the pair of magnetically biased longitudinal magnetic biasing layers 54a' and 54b', deposited in a first, non-antiferromagnetic crystalline form, is transformed into a second crystalline form wherein said biasing layers now have antiferromagnetic properties and become antiferromagnetically coupled magnetically biased longitudinal biasing layers 54a''' and 54b'''; and (3) the magnetically biased ferromagnetic free layer 44' is transformed into an antiferromagnetically coupled magnetically biased ferromagnetic free layer 44'', incident to thermal annealing within a third thermal annealing environment 62 in which there is no external magnetic field present.

Within the third preferred embodiment of the present invention, the third thermal annealing environment 62 is provided while employing methods, materials and conditions analogous or equivalent to the methods, materials and conditions employed for providing the third thermal annealing environment 36 within the second preferred embodiment of the present invention as illustrated within the schematic air bearing surface (ABS) view diagram of FIG. 8 or the second thermal annealing environment 18 within the first preferred embodiment of the present invention as illustrated within the schematic air bearing surface view diagram of FIG. 3.

Upon forming the spin valve magnetoresistive (SVMR) sensor element whose schematic air bearing surface (ABS) view diagram is illustrated in FIG. 13, there is formed a spin valve magnetoresistive (DSMR) sensor element, which for reasons as outlined with respect to the first preferred embodiment of the present invention, possesses optimal and enhanced magnetic properties.

Figure 14:
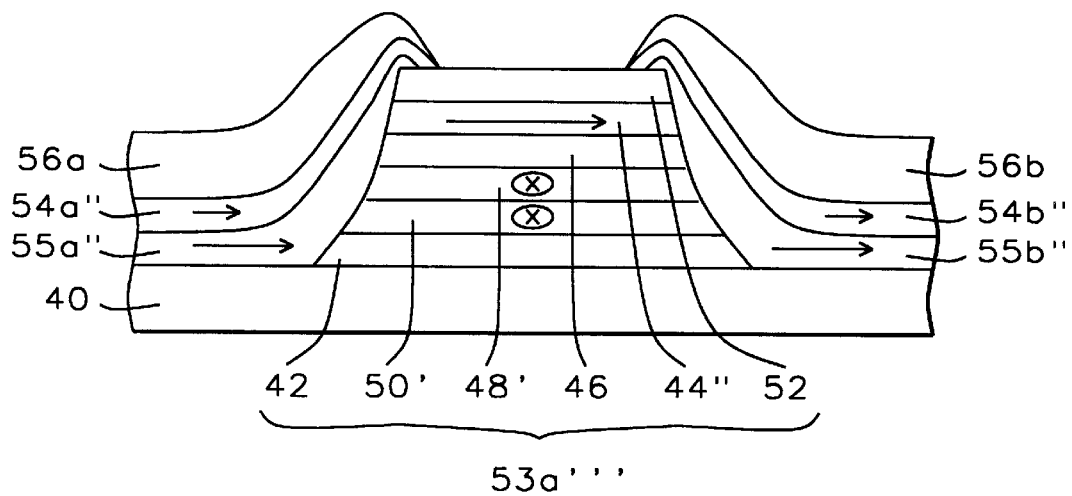
FIG. 14 shows a schematic air bearing surface (ABS) view diagram of an alternate spin valve magnetoresistive (SVMR) sensor element in accord with the third preferred embodiment of the present invention.

Referring now to FIG. 14, there is shown a schematic air bearing surface (ABS) of an alternate spin valve magnetoresistive (SVMR) sensor element in accord with the third preferred embodiment of the present invention.

Shown in FIG. 14 is a spin valve magnetoresistive (SVMR) sensor element otherwise equivalent to the spin valve magnetoresistive (SVMR) sensor element whose schematic air bearing surface (ABS) view diagram is illustrated in FIG. 13, but wherein there is reversed with respect to the non-magnetic conductor spacer layer 46 a positioning of: (1) the antiferromagnetically coupled magnetically biased ferromagnetic free layer 44''; and (2) the pair of layers consisting of the antiferromagnetically coupled magnetically biased ferromagnetic pinned layer 48' and the antiferromagnetically coupled magnetically biased pinning material layer 50'' to thus form in the alternative of the three times thermally annealed spin valve magnetoresistive (SVMR) stack layer 53''' as illustrated within the schematic air bearing surface (ABS) view diagram of FIG. 13 an alternate three times thermally annealed spin valve magnetoresistive (SVMR) stack layer 53a'''.

The spin valve magnetoresistive (SVMR) sensor element whose schematic air bearing surface (ABS) view diagram is illustrated in FIG. 14 may be formed in the alternative of the spin valve magnetoresistive (SVMR) sensor element whose schematic air bearing surface (ABS) view diagram is illustrated in FIG. 13 by simple substitution of ordering of the above noted layers when fabricating the spin valve magnetoresistive (SVMR) sensor element whose schematic air bearing surface (ABS) view diagram is illustrated within FIG. 14, without otherwise changing the thicknesses of any of the foregoing layers or the methods for fabrication of any of the foregoing layers when fabricating the spin-valve magnetoresistive (SVMR) sensor element whose schematic air bearing surface (ABS) view diagram is illustrated in FIG. 14.

Although not specifically discussed within the context of any of the foregoing preferred embodiments of the present invention, any of the thermal annealing environments employed within the present invention preferably employs a nitrogen thermal annealing ambient, although other thermal annealing ambient gases may also be employed within the present invention.

EXAMPLES

There was obtained a series of three alumina-titanium carbide substrates and formed upon each substrate was a magnetoresistive (MR) stack layer comprising: (1) a nickel-chromium-iron seed layer formed to a thickness of about 65 angstroms from a nickel-chromium-iron alloy of nickel-chromium-iron weight ratio about 48:40:12; (2) a magnetically unbiased magnetoresistive (MR) layer formed upon the seed layer of a nickel-iron (80:20, w:w) magnetoresistive (MR) material at a thickness of about 80 angstroms; (3) a magnetically unbiased magnetic biasing material layer formed upon the magnetically unbiased magnetoresistive (MR) layer of a nickel-manganese (42:58; atomic ratio) antiferromagnetic material at a thickness of about 250 angstroms; and (4) a cap layer formed upon the magnetically unbiased magnetic biasing material layer of tantalum formed to a thickness of about 100 angstroms.

There was then thermally annealed the three magnetoresistive (MR) stack layers while employing a multistep thermal annealing method in accord with the preferred embodiment of the present invention. For a first of the magnetoresistive (MR) stack layers, the thermal annealing method employed: (1) a first thermal annealing at a temperature of about 230 degrees centigrade for a time period of about 5 hours at an extrinsic magnetic bias field of about 250 oersteds, followed by; (2) a second thermal annealing at a temperature of about 250 degrees centigrade for a time period of about 10 hours. A second of the three magnetoresistive (MR) stack layers was thermally annealed at: (1) a first thermal annealing temperature of about 260 degrees centigrade for a time period of about 0.5 hours at an extrinsic magnetic bias field of about 250 oersteds, followed by; (2) a second thermal annealing at a temperature of about 260 degrees centigrade for a time period of about 4.5 hours. Finally, the third magnetoresistive (MR) stack layer was thermally annealed at a temperature of about 250 degrees centigrade for a time period of about 10 hours, in absence of an extrinsic magnetic bias field. Measurements were obtained of antiferromagnetic exchange field for each magnetoresistive (MR) stack layers at intervals immediately subsequent to each of the foregoing thermal annealing exposures, while employing hysteresis curve measurements as are conventional in the art of magnetoresistive (MR) sensor element fabrication. The results of the measurements are reported in Table I, as below.

TABLE I

| Example | Annealing Conditions | Measured Exchange Field |
|---|---|---|
| 1 | 230C/5 hours/250 Oe | 0 Oe |
|   | 250C/10 hours/0 Oe | 377 |
| 2 | 260C/0.5 hours/250 Oe | 0 |
|   | 260C/4.5 hours/0 Oe | 200 |
| 3 | 250C/10 hours/0 Oe | 0 |

As is seen from review of the data within Table I, there is formed while employing the method of the present invention a magnetoresistive (MR) stack layer with substantial exchange bias while employing a multistep thermal annealing method wherein an elevated temperature step within the multistep thermal annealing method is provided without an extrinsic magnetic bias field such that when thermally annealing the magnetoresistive (MR) stack layer at the elevated temperature there is avoided degradation of other layers formed within a magnetoresistive sensor element within which is employed the magnetoresistive (MR) stack layer.

As is understood by a person skilled in the art, the preferred embodiments and examples of the present invention are illustrative of the present invention rather than limiting of the present invention. Revisions and modifications may be made to methods, materials, structures and dimensions through which is formed a magnetoresistive (MR) sensor element, a dual stripe magnetoresistive (DSMR) sensor element and a spin valve magnetoresistive (SVMR) sensor element in accord with the preferred embodiments and examples of the present invention while still providing a magnetoresistive (MR) sensor element in accord with the present invention, in accord with the appended claims.

What is claimed is:

1. A method for forming a magnetically biased magnetoresistive (MR) layer comprising:
    providing a substrate;
    forming over the substrate a ferromagnetic magnetoresistive (MR) layer;
    forming in contact with the ferromagnetic magnetoresistive (MR) material layer a magnetic material layer which is a first crystalline phase of a multiphasic material having at least two crystalline phases, and wherein said first crystalline phase does not appreciably antiferromagnetically exchange couple with the ferromagnetic magnetoresistive (MR) layer;
    annealing thermally while employing a first thermal annealing method employing an extrinsic magnetic bias field the magnetic material layer formed of the first crystalline phase to form a magnetically biased magnetic material layer formed of the first crystalline phase;
    annealing thermally while employing a second thermal annealing method without employing an extrinsic magnetic bias field the magnetically biased magnetic material layer formed of the first crystalline phase to form, thereby, a second crystalline phase of said magnetically biased magnetic material, within which second phase it is an antiferromagnetic material and becomes antiferromagnetically coupled to the said ferromagnetic magnetoresistive (MR) material layer.

2. The method of claim 1 wherein the magnetoresistive (MR) material layer is formed within a magnetoresistive (MR) sensor element selected from the group consisting of single stripe magnetoresistive (SSMR) sensor elements, dual stripe magnetoresistive (DSMR) sensor elements and spin valve (SVMR) sensor elements.

3. The method of claim 1 wherein the ferromagnetic magnetoresistive (MR) material layer is formed of a ferromagnetic magnetoresistive (MR) material selected from the group consisting of nickel-iron permalloy alloy ferromagnetic magnetoresistive (MR) materials, cobalt-iron alloy ferromagnetic magnetoresistive (MR) materials, other nickel alloy ferromagnetic magnetoresistive (MR) materials, other iron alloy ferromagnetic magnetoresistive (MR) materials, cobalt ferromagnetic magnetoresistive (MR) materials, and composites of those said materials.

4. The method of claim 1 wherein the crystalline multiphasic magnetic material is selected from the group consisting of nickel-manganese alloys, platinum-manganese alloys and platinum-palladium-manganese alloys.

5. The method of claim 1 wherein the ferromagnetic magnetoresistive (MR) material layer is formed to a thickness of from about 5 to about 800 angstroms.

6. The method of claim 1 wherein the magnetic material layer is formed to a thickness of from about 50 to about 500 angstroms.

7. A method for forming a dual stripe magnetoresistive (MR) sensor element comprising:
    providing a substrate;
    forming on the substrate a first ferromagnetic magnetoresistive (MR) material layer magnetically biased by antiferromagnetic coupling with a first antiferromagnetic material layer;
    forming on the antiferromagnetically biased first ferromagnetic layer a blanket interstripe dielectric layer;
    forming on the blanket interstripe dielectric layer a second ferromagnetic magnetoresistive (MR) material layer;
    forming, in contact with the second ferromagnetic magnetoresistive (MR) material layer a second magnetic material layer which is a first crystalline phase of a multiphasic material having at least two crystalline phases, wherein said first crystalline phase does not appreciably antiferromagnetically exchange couple with the second ferromagnetic magnetoresistive (MR) material layer;
    annealing thermally while employing a first thermal annealing method employing an extrinsic magnetic bias field the second magnetic material layer formed in its first crystalline phase to form a magnetically aligned second magnetic material layer and a magnetically aligned second ferromagnetic magnetoresistive (MR) layer;
    annealing thermally while employing a second thermal annealing method without employing an extrinsic magnetic bias field the magnetically aligned second magnetic material layer formed in its first crystalline phase to form a second crystalline phase of said magnetic material layer in which said second crystalline phase said magnetic material layer is an antiferromagnetic layer antiferromagnetically coupled to the magnetically aligned second ferromagnetic magnetoresistive (MR) layer.

8. The method of claim 7 wherein the first ferromagnetic magnetoresistive (MR) material layer and the second ferromagnetic magnetoresistive (MR) material layer are formed of a ferromagnetic magnetoresistive (MR) material selected from the group consisting of nickel-iron permalloy alloy ferromagnetic magnetoresistive (MR) materials, cobalt-iron alloy ferromagnetic magnetoresistive (MR) materials, other nickel alloy ferromagnetic magnetoresistive (MR) materials, other iron alloy ferromagnetic magnetoresistive (MR) materials, cobalt ferromagnetic magnetoresistive (MR) materials, and composites of those said materials.

9. The method of claim 1 wherein the first antiferromagnetic material layer and the second antiferromagnetic material layer are formed of an antiferromagnetic material selected from the group consisting of nickel-manganese alloys, platinum-manganese alloys and platinum-palladium-manganese alloys.

10. The method of claim 7 wherein the first antiferromagnetic material layer and the second antiferromagnetic material layer are formed of a single antiferromagnetic material.

11. The method of claim 7 wherein the antiferromagnetically coupled magnetically aligned first antiferromagnetic material layer and the antiferromagnetically coupled magnetically aligned second antiferromagnetic material layer are magnetically aligned in an anti-parallel direction.

12. The method of claim 7 wherein the antiferromagnetically coupled magnetically biased first ferromagnetic magnetoresistive (MR) material layer is antiferromagnetically coupled with the antiferromagnetically coupled magnetically biased first antiferromagnetic material layer incident to thermal annealing while employing a third thermal annealing method employed before the first thermal annealing method or the second thermal annealing method.

13. A method for forming a spin valve magnetoresistive (SVMR) sensor element comprising:

providing a substrate;

providing a substrate;

forming over the substrate an antiferromagnetically coupled magnetically biased ferromagnetic pinned layer antiferromagnetically coupled with a first antiferromagnetic pinning material layer, said coupling being produced by a first annealing method in the presence of an extrinsic magnetic field;

forming over the ferromagnetic pinned layer a ferromagnetic free layer, said ferromagnetic free layer being separated from said ferromagnetic pinned layer by a non-magnetic spacer layer;

forming in magnetic contact with the ferromagnetic free layer a second magnetic material layer which is a first crystalline phase of a multiphasic material having at least two crystalline phases, wherein said first crystalline phase does not appreciably antiferromagnetically exchange couple with the ferromagnetic free layer;

annealing thermally while employing a second thermal annealing method employing an extrinsic magnetic bias field the second magnetic material layer formed in its first crystalline phase to form a magnetically aligned second magnetic material layer;

annealing thermally while employing a third thermal annealing method without employing an extrinsic magnetic bias field the magnetically aligned second magnetic material layer formed in its first crystalline phase to form a second crystalline phase of said magnetic material layer in which said second crystalline phase said magnetic material layer is an antiferromagnetic layer antiferromagnetically coupled to the ferromagnetic free layer.

14. The method of claim 13 wherein the ferromagnetic free layer and the ferromagnetic pinned layer are formed of a ferromagnetic magnetoresistive (MR) material selected from the group consisting of nickel-iron permalloy alloy ferromagnetic magnetoresistive (MR) materials, cobalt-iron alloy ferromagnetic magnetoresistive (MR) materials, other nickel alloy ferromagnetic magnetoresistive (MR) materials, other iron alloy ferromagnetic magnetoresistive (MR) materials, cobalt ferromagnetic magnetoresistive (MR) materials, and composites of those said materials.

15. The method of claim 13 wherein the antiferromagnetic pinning material layer and the second antiferromagnetic material layer are formed of an antiferromagnetic material selected from the group consisting of nickel-manganese alloys, platinum-manganese alloys and platinum-palladium-manganese alloys.

16. The method of claim 13 wherein the antiferromagnetic pinning material layer and the second antiferromagnetic material layer are formed of the same antiferromagnetic material.

17. The method of claim 13 wherein the first antiferromagnetic pinning material layer and the second magnetic material layer are magnetically aligned in mutually perpendicular directions.

\* \* \* \* \*